US006384629B2

(12) United States Patent
Huang et al.

(10) Patent No.: US 6,384,629 B2
(45) Date of Patent: May 7, 2002

(54) HIGH-SPEED PROGRAMMABLE INTERCONNECT

(75) Inventors: Joseph Huang, San Jose; Chiakang Sung, Milpitas; Bonnie I. Wang, Cupertino; Khai Nguyen, San Jose; Xiaobao Wang, Santa Clara; Richard G. Cliff, Milpitas, all of CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/738,403

(22) Filed: Dec. 15, 2000

Related U.S. Application Data

(63) Continuation of application No. 09/094,356, filed on Jun. 9, 1998, now Pat. No. 6,262,595.
(60) Provisional application No. 60/049,478, filed on Jun. 13, 1997, provisional application No. 60/049,275, filed on Jun. 10, 1997, provisional application No. 60/049,246, filed on Jun. 10, 1997, provisional application No. 60/049,247, filed on Jun. 10, 1997, provisional application No. 60/049,245, filed on Jun. 10, 1997, provisional application No. 60/049,243, filed on Jun. 10, 1997, provisional application No. 60/052,990, filed on Jun. 10, 1997, and provisional application No. 60/050,953, filed on Jun. 13, 1997.

(51) Int. Cl.⁷ .................................................. H01L 25/00
(52) U.S. Cl. .............................. 326/41; 326/38; 326/40
(58) Field of Search ........................................ 326/38–41

(56) References Cited

U.S. PATENT DOCUMENTS 4,609,986 A     9/1986   Hartmann et al.
B1 4,617,479 A 10/1986   Hartmann et al.
4,642,487 A     2/1987   Carter
4,713,557 A   12/1987    Carter
5,241,224 A     8/1993   Pedersen et al.
5,260,611 A   11/1993    Cliff et al.
5,336,951 A     8/1994   Josephson et al.
5,455,525 A   10/1995    Ho et al.
5,497,108 A     3/1996   Menon et al.
5,528,170 A  *  6/1996   Britton et al. ................. 326/41
5,583,452 A   12/1996    Duong et al.
5,710,550 A  *  1/1998   Hsieh et al. ............ 340/825.79
5,799,176 A  *  8/1998   Kapusta et al. .............. 395/556
5,808,479 A     9/1998   Sasaki et al.
5,825,203 A   10/1998    Kusunoki et al.
5,880,598 A  *  3/1999   Duong .......................... 326/41
5,894,565 A     4/1999   Furtek et al.

OTHER PUBLICATIONS

Altera Corp., "FLEX 8000 Programmable Logic Device Family," data sheet, version 4, pp. 1–22 (Aug. 1994).

(List continued on next page.)

Primary Examiner—Michael Tokar
(74) Attorney, Agent, or Firm—Townsend and Townsend and Crew LLP; Steven J. Cahill

(57) ABSTRACT

An improved interconnection between horizontal conductors and the input to logic elements. A signal regeneration circuit is provided in the path between the horizontal conductor and the logic element, thereby isolating and boosting the signal. This allows for faster switching operation. A path is provided allowing the selective routing of signals from the horizontal conductors to the vertical conductors, without passing through a logic element. Also, a path is provided to allow a horizontal conductors to be routed to any of a plurality of vertical conductors.

40 Claims, 9 Drawing Sheets

OTHER PUBLICATIONS

Xilinix Corp., The Programmable Logic Data Book, "XC4000, XC4000A, XC4000H Logic Cell Array Families," version 4, pp. 2–45 to 2–59 (Aug. 1994).

Xilinix Corp., The Programmable Logic Data Book, "XC3000, XC3000A, XC3000L, XC3100, XC3100A Logic Cell Array Families," pp. 2–105 to 2–152 (1994).

Xilinix Corp., The Programmable Gate Array Data Book, "XC3000 Logic Cell Array Family," pp. 2–1 to 2–51 (1992).

Xilinix Corp., Technical Data, "XC5200 Logic Cell Array Family," Preliminary (v 2.0) (May 1995).

Xilinix Corp., The Programmable Gate Array Data Book, "XC2064/XC2018 Logic Cell Array," pp. 2–61 to 2–99.

Altera Corp., 1996 Data Book, "MAX 7000," pp. 191–219 (Jun. 1996).

Altera Corp., 1996 Data Book, "MAX 9000 Programmable Logic Device Family," data sheet, ver. 4, pp. 157–191 (Jun. 1996).

Altera Corp., "MAX 7000 Programmable Logic Device Family," data sheet, ver. 1, pp. 69–81 (Aug. 1993).

Altera Corp., "MAX 5000/EPS464 Programmable Logic Device Family," data sheet, ver. 1, pp. 149–160 (Aug. 1993).

* cited by examiner

HIGH-SPEED PROGRAMMABLE INTERCONNECT

CROSS-REFERENCE TO RELATED CASES

This application is a continuation of and claims benefit of U.S. appl. Ser. No. 09/094,356, filed Jun. 9, 1998, now U.S. Pat. No. 6,262,595, and claims priority from U.S. provisional application Ser. No. 60/049,275, filed Jun. 10, 1997; Ser. No. 60/049,478, filed Jun. 13, 1997; Ser. No. 60/049,246, filed Jun. 10, 1997; Ser. No. 60/052,990, filed Jun. 10, 1997; Ser. No. 60/049,247, filed Jun. 10, 1997; Ser. No. 60/049,243, filed Jun. 10, 1997; Ser. No. 60/050,953, filed Jun. 13, 1997; and Ser. No. 60/049,245, filed Jun. 10, 1997, all of which are incorporated herein by reference for all purposes.

BACKGROUND OF THE INVENTION

The present invention relates to the field of programmable logic devices, and more particularly, to interconnection resources for programmable logic devices.

Logic devices and methods of their operation are well known to those of skill in the art. Programmable logic devices have found particularly wide application as a result of their combined low up-front cost and versatility to the user. Altera's FLEX® line of programmable logic are among the most advanced and successful programmable logic devices. The FLEX architecture provides a large matrix of small logic elements (also known as macrocells) that can be programmably configured and interconnected to provide desired logic functions.

In many programmable logic devices, for example, a number of logic elements are arranged in groups to form larger entities referred to as logic array blocks ("LABs"). The various LABs are arranged in a two-dimensional array and are connectable to each other and to I/O pins of the device though continuous lines that run the entire length/width of the device. These lines are referred to as horizontal interconnect and vertical interconnect or collectively as "global" interconnect lines. In Altera's line of production these may include what are referred to as "Horizontal FastTracks™" and "Vertical FastTracks™."

Each logic element can perform various combinational and registered logical operations. A local interconnect resource is also provided to allow the logic elements in a LAB to share signals without using the global interconnection resources. Additional detail regarding the FLEX devices may be found, for example, in Altera's Data Book, January 1998, along with U.S. Pat. Nos. 5,260,610 and 5,260,611, all of which are incorporated herein by reference for all purposes.

These logic devices have met with substantial success and are considered pioneering in the area of programmable logic. While pioneering in the industry, certain limitations still remain. For example, a large portion of the delay in the critical path is due to delay in the interconnect resources. A certain amount of delay exists in the connection between the global interconnect structure and the LABs. Thus a faster global interconnect can increase the overall system performance significantly.

Another aspect of programmable logic integrated circuits that may be improved is the programming flexibility of the interconnect resources in the logic device. In currently available devices, a signal may be routed from a vertical conductor to a horizontal conductor without passing through a logic element, but for a signal to be routed from a horizontal conductor to a vertical conductor, it must pass through a logic element. Also, currently available devices do not provide complete flexibility in routing between horizontal and vertical lines. For example, at a particular junction, a vertical conductor may only be connected to a single horizontal conductor. It is desirable to be able to select from among a plurality of vertical conductors as the destination, thereby increasing the routing flexibility of the logic device.

For at least the above reasons, a PLD which provides faster and more flexible interconnect resources is needed.

SUMMARY OF THE INVENTION

An improved programmable logic integrated circuit with high-speed interconnection resources and greater routability is described.

In accordance with a first aspect of the present invention, a faster interconnection between the horizontal interconnect resource and the local interconnect is provided. The local interconnect provides a path to the logic inputs of the logic elements. A signal regeneration circuit is provided in the path between horizontal conductors and the local interconnection. The signal regeneration circuit is preferably a pair of cross-coupled inverters that isolate the capacitance of the horizontal interconnect resource from the local interconnect, thereby allowing the switching to occur at a faster rate. It also boosts the signal allowing for faster switching operation.

In accordance with another aspect of the present invention, improved routability between the horizontal and vertical interconnects is described. A path is provided allowing the selective routing of signals from the horizontal interconnect to the vertical interconnect, without passing through a logic element. The horizontal interconnect may be selectively coupled to several of the vertical interconnect conductors in some embodiments.

In accordance with yet another aspect of the present invention, improved routability between the vertical and horizontal interconnects is described. A path is provided to allow a horizontal interconnect to be routed to any of a plurality of vertical interconnect conductors. In an embodiment, a multiplexer allows the selection from a plurality of horizontal interconnect conductors to be routed to the plurality of vertical interconnect conductors.

A further understanding of the nature and advantages of the present invention may be realized by reference to the remaining portions of the specification and the drawings.

DETAILED DESCRIPTION OF THE SPECIFIC EMBODIMENTS

Figure 1:
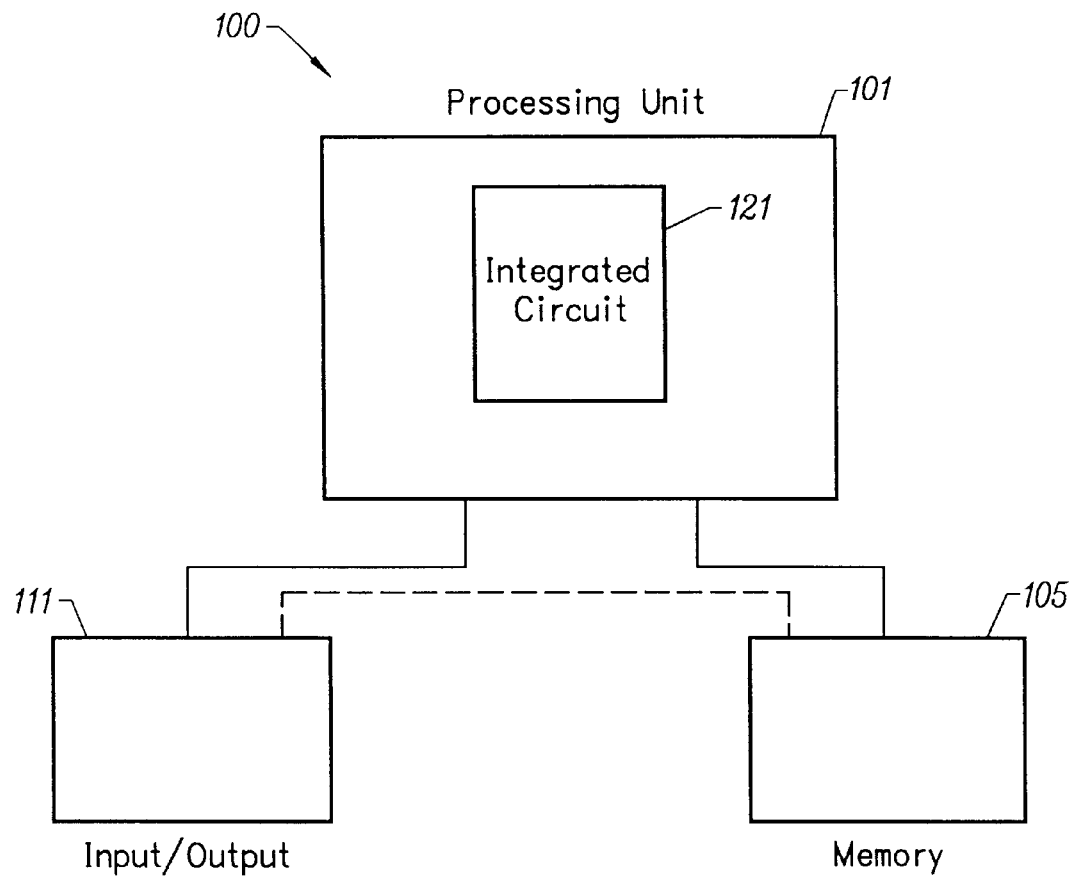
FIG. 1 is a diagram of a system incorporating a programmable logic integrated circuit.

FIG. 1 illustrates a typical environment in which an integrated circuit having been designed according to the principles of the present invention may be embodied. A digital system 100 has a processing unit 101 that is coupled with a memory 105 and an input/output device 111. A personal computer is an example of digital system 100; however, a wide variety of electronic and consumer products will find beneficial use from the present invention. For example, the present invention will find application in telecommunications, switches, networks, and many other areas of technology.

Digital system 100 contains one or more programmable logic integrated circuits 121 of the type described in the present invention. Programmable logic integrated circuit 121 may be, for example, a programmable logic device (sometimes referred to as PALs, PLAs, FPLAs, PLDs, EPLDs, CPLDS, EEPLDs, LCAs, or FPGAs.) Programmable logic devices are described for example, in U.S. Pat. No. 4,617,479, incorporated herein by reference for all purposes. Such devices are currently represented by, for example, Altera's FLEX® series of PLDs and are described, for example, in the Altera Data Book, January 1998, which is incorporated herein in its entirety by reference for all purposes. In FIG. 1, programmable logic integrated circuit 121 is shown as a part of processing unit 101, but, memory 105 or input/output device 111 may also advantageously contain programmable logic integrated circuit 121.

Figure 2:
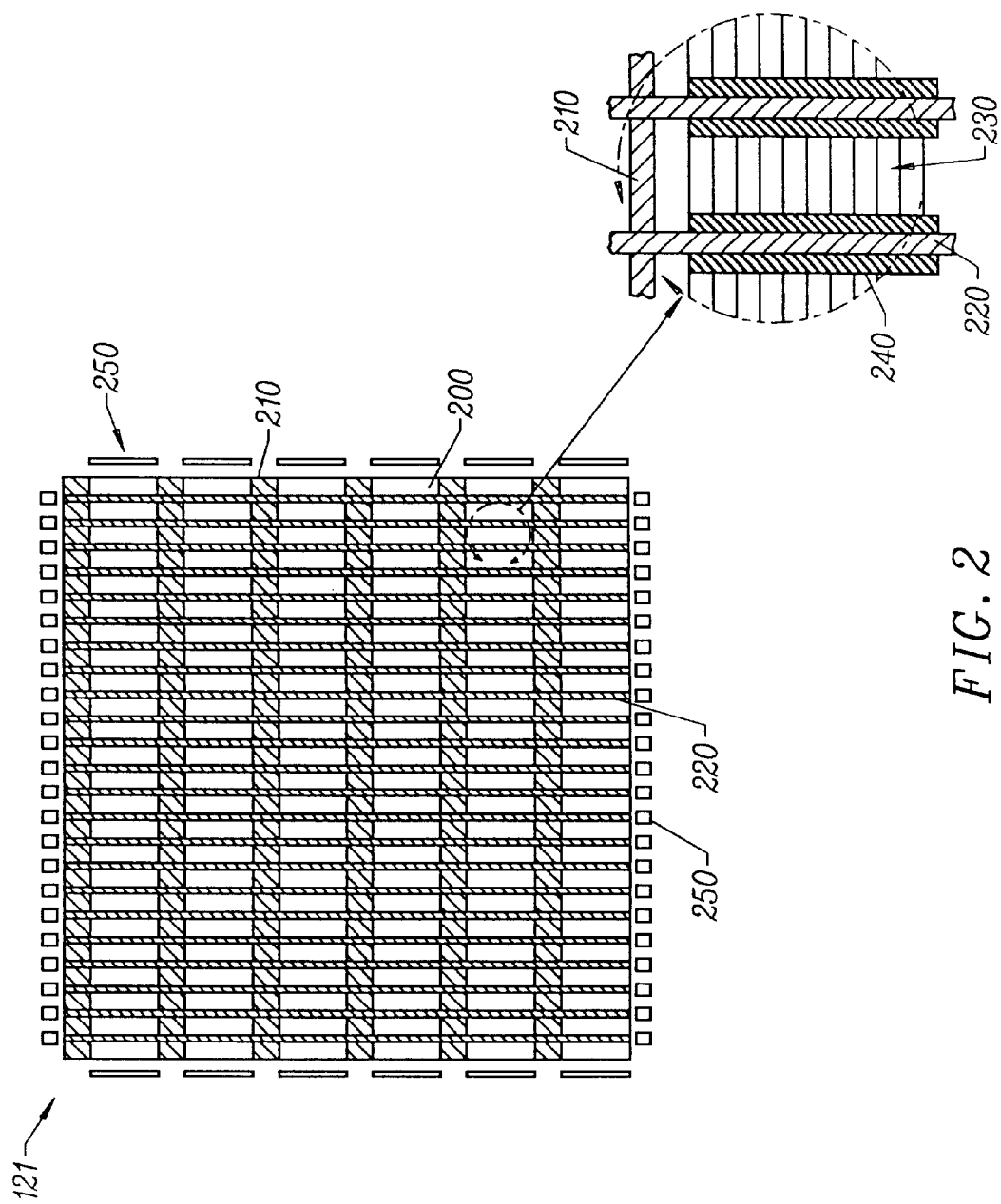
FIG. 2 is a block diagram of an exemplary architecture of a programmable logic integrated circuit of the present invention.

FIG. 2 is a simplified block diagram of the overall internal architecture and organization of an exemplary programmable logic integrated circuit 121. Many details of the architecture, organization, and circuit design are not necessary for an understanding of the present invention and such details are not shown. The exemplary PLD of FIG. 2 shows an array of logic array blocks (LABs) 200 interconnected by a global interconnect including horizontal conductors 210 and vertical conductors 220. Each LAB 200 is a physically grouped set of logical resources including logic elements 230.

Logic elements 230 within a LAB 200 can be programmably coupled to each other and sometimes to logic elements 230 in an adjacent LAB 200 by means of a local interconnect 240. Details of LAB 200, logic elements 230, and local interconnect 240 may also be found in the Altera Data Book, January 1998, previously incorporated by reference. Other designs may also be preferentially used. Horizontal and vertical conductors 210 and 220 may also be coupled to input/output elements 250 for routing signals from programmable logic integrated circuit 121.

Figure 3:
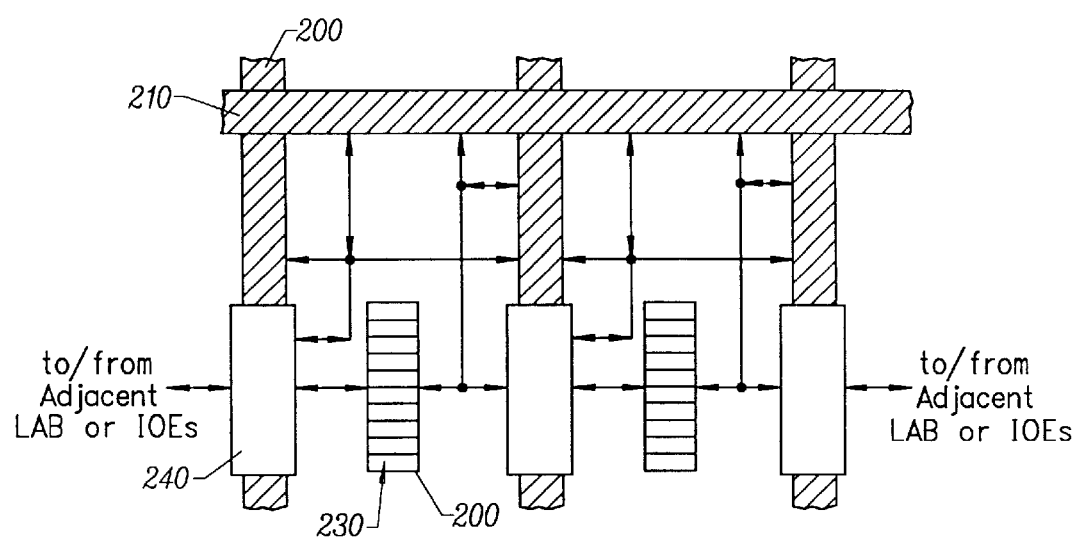
FIG. 3 is a more detailed block diagram of the exemplary architecture of a programmable logic integrated circuit of the present invention.

FIG. 3 shows a more detailed block diagram of two LABs 200 and the interconnections between horizontal conductors 210, vertical conductors 220, local interconnects 240, and LABS 200. Each LAB 200 is coupled to the local interconnect 240 on its left and the local interconnect to its right in the matrix. Other architectures may also be used without departing from the spirit and scope of the present invention.

Figure 4:
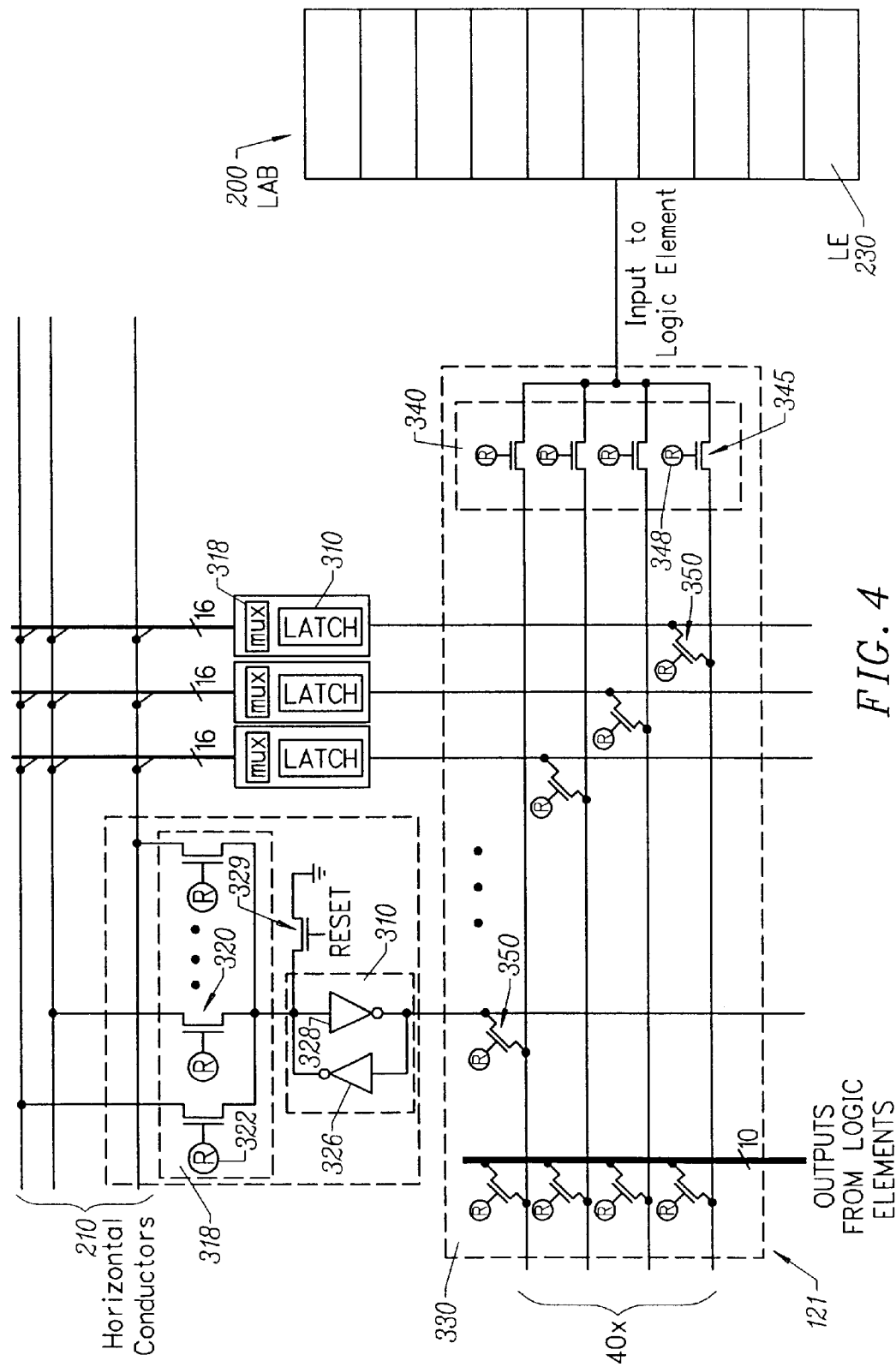
FIG. 4 is a block diagram of the interconnection between horizontal conductors and logic inputs to logic elements according to the present invention.

FIG. 4 shows a block diagram of the programmable connections between horizontal conductors 210 and the logic inputs to logic elements 230. As mentioned above, horizontal conductors 210 are a part of a global interconnection resource. They may extend across several LABs 200, and possibly across the entirety of PLD 121. Horizontal conductors 210 are coupled to the logic inputs of logic elements 230 through local interconnect 240. Although only one logic input of one logical element 230 is depicted in FIG. 4, it will be recognized that the structure may be substantially replicated many times to accommodate all of the logic inputs for the logic elements in LAB 200.

One or more of horizontal conductors 210 are selectively coupled to a signal regeneration circuit 310. In the specific embodiment, a multiplexer 318 is provided to programmably select from among a plurality of horizontal conductors 210 for connecting one of them to signal regeneration circuit 310. Multiplexer 318 may be a plurality of transistors 320 connected in parallel with the source of each being coupled to differing ones of horizontal conductors 210 and the drains being commonly coupled to an input of signal regeneration circuit 310. A programming element 322 is coupled to the gates of each of transistors 310 to allow one of the paths to be selected.

Programming element 322 and other programming elements described herein may be a memory cell. For example, in the specific embodiment, programming element 322 is an SRAM cell.

Although any size multiplexer may be used, in the specific embodiment multiplexer 318 is a 16-1 multiplexer. This arrangement gives the user flexibility in selecting any one of 16 different horizontal conductors 210 for routing to a particular line of local interconnect 240.

Signal regeneration circuit 310 may be comprised of a pair of cross-coupled inverting buffers 326 and 328. A transistor 329 may also be provided selectively coupling the input of signal regeneration circuit 310 to GROUND. A reset signal is coupled with the gate of transistor 329. This provides a method of initializing the state of regeneration circuit 310 to a known state at the time of resetting programmable logic integrated circuit 121.

Signal regeneration circuit 310 serves several functions that is advantageous to the present invention. For example, it isolates local interconnect 240 from the capacitance on horizontal conductors 210. Thus, a signal on local interconnect 240 can switch polarity at a faster rate than it would otherwise be able to switch. Further, signal regeneration circuit 310 boosts the signal also allowing it to switch at a faster rate.

Multiplexer 318 and signal regeneration circuit 310 may be replicated a number of times. The output of each signal regeneration circuit 310 is coupled to a different line of local interconnect 240. In the specific embodiment, 22 instances of multiplexer 318 and signal regeneration circuit 310 are provided. Local interconnect 240 also has 10 lines that come from the outputs of the corresponding LAB 200 making a total of 32 lines in each local interconnect 240. In the specific embodiment, half of the 10 lines come from the LAB 200 to the right of local interconnect 240, and half come from the LAB 200 to the left of local interconnect 240.

The individual lines in local interconnect 240 may be programmably coupled to the logic inputs of logic elements 230 by a logic input selector circuit 330. Logic input selector circuit 330 provides a multiplexer 340, the output of which is coupled to one of the logic inputs of logic element 230. Multiplexer 340 may comprise a number of transistors 345 coupled in parallel, with the gates of transistors 345 being coupled to programmable elements 348. Each of the inputs to multiplexer 340 are coupled to traces that extend perpendicularly to local interconnect 240. Transistors 345 are coupled between the individual lines of local interconnect 240 and the traces.

Logic input selector 330 provides a logic input to one of logic elements 230. In the specific embodiment, each logic element 230 has four inputs, and each LAB 200 has 10 logic elements 230. Thus, the circuitry shown in FIG. 4 is replicated 40 times, once for each logic input to the LAB. In the specific embodiment, two of the inputs to each logic element 230 may be coupled to the local interconnect from LAB 240 to its left, and the other two may be coupled to the local interconnect from LAB 240 to its right.

Figure 5:
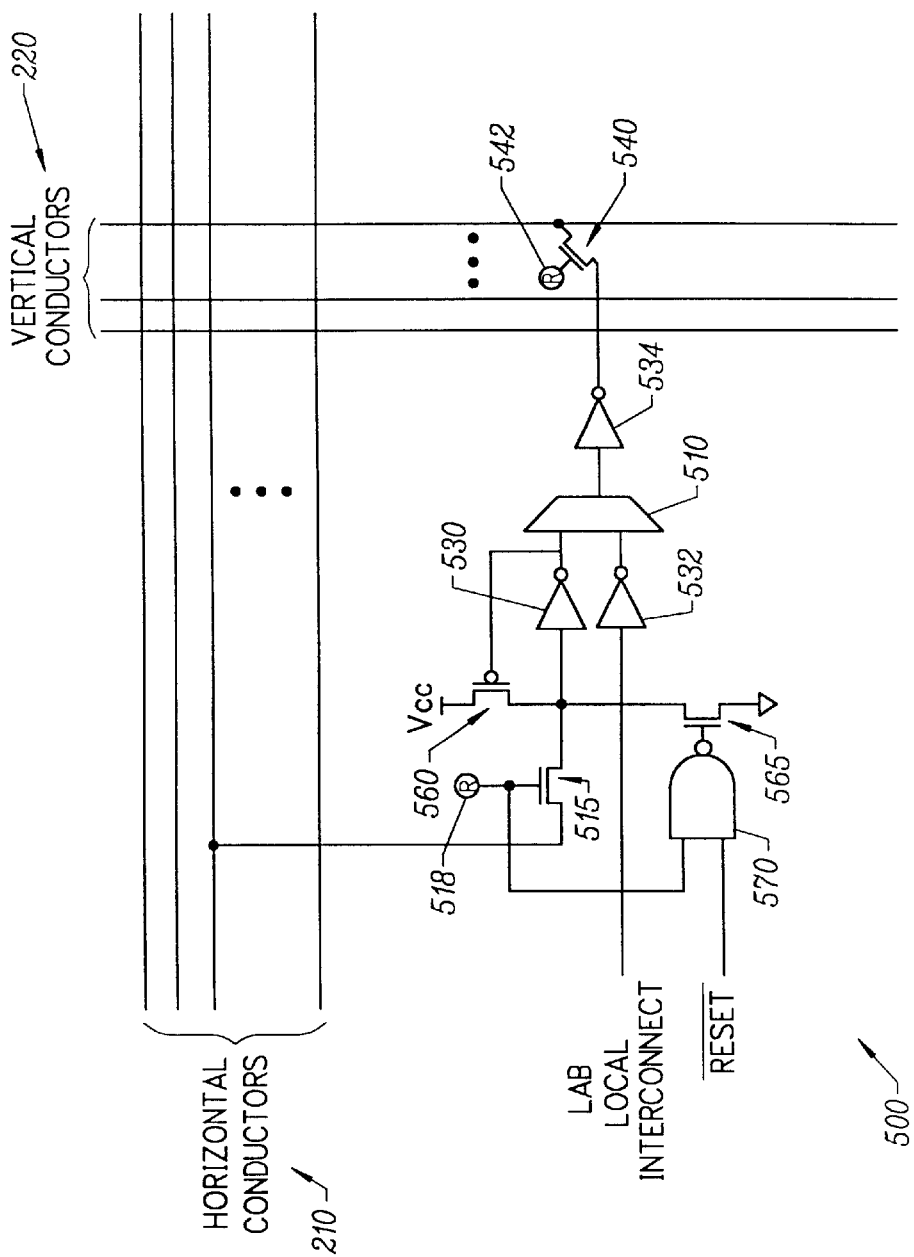
FIG. 5 is a block diagram of the interconnection from vertical interconnect conductors to horizontal interconnect conductors according to the present invention.

FIG. 5 shows a column interconnect 500. Column interconnect 500 provides a path for coupling horizontal conductors 210 or local interconnect 240, to vertical conductors 220. One of horizontal conductor 210 is coupled to an input of a multiplexer 510 through a transistor 515. The gate of transistor 515 is coupled to a programmable element 518. One of the local interconnect lines 240 is coupled to another input of multiplexer 510. The selection input to multiplexer 510 is coupled to a programmable element (not shown) for selecting which input is to be routed to the output of multiplexer 510.

The specific embodiment includes inverting buffers 530 and 532 on the inputs of multiplexer 510, and an inverting buffer 534 on the output of multiplexer 234. The output of inverting buffer 534 is selectively coupled to one of the vertical conductors 220 through a transistor 540 with a programming element 542 coupled to its gate. In some embodiments, the output may be coupled to a plurality of vertical conductors 220.

A pull-up transistor 560 is coupled between transistor 515 and inverting buffer 530. Pull-up transistor 560 is a p-type device and has a gate coupled to the output of inverting buffer 530. This boosts the signal as it passes through column interconnect 500. A pull-down transistor 565 is also provided between transistor 515 and inverting buffer 530. A NAND gate 570 is coupled to the gate of pull-down transistor 565. NAND gate 570 is coupled to programming element 518 and to the inverse of a reset signal. Thus, when the horizontal conductor path through transistor 515 is not selected, the input to inverting buffer is pulled to GROUND. It is also pulled to GROUND when the reset signal is asserted.

Figure 6:
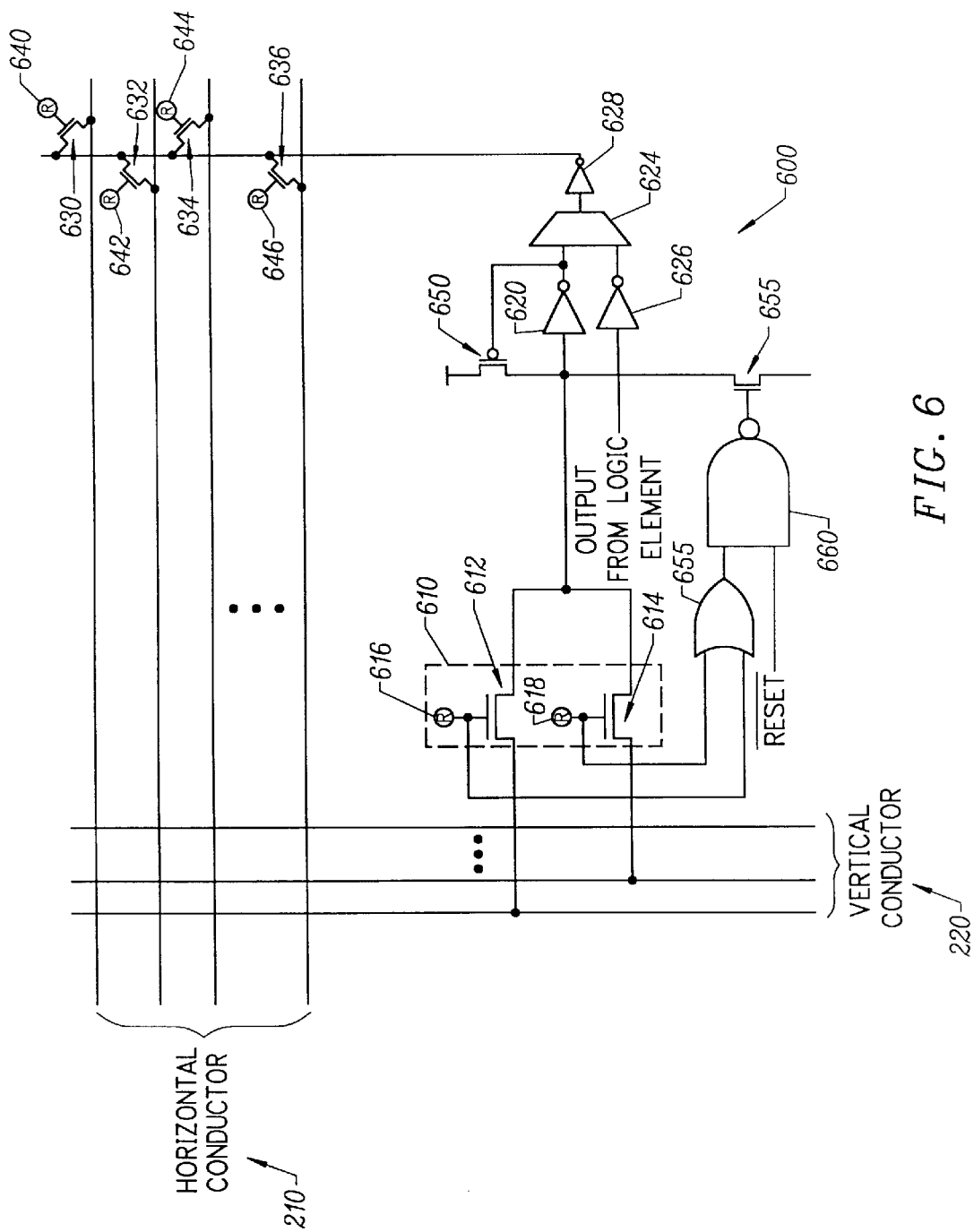
FIG. 6 is a block diagram of the interconnection from horizontal interconnect conductors to vertical interconnect conductors according to the present invention.

FIG. 6 shows a row interconnect circuit 600. Row interconnect circuit 600 provides a path for one or more vertical conductors 220 to one or more horizontal conductors 210. A path is also provided to route the output from one of the logic elements 230 to one or more horizontal conductors 210.

In the specific embodiment, row interconnect circuit 600 is coupled to two of the vertical conductors 220. A multiplexer 610 selects between the two vertical conductors. Multiplexer 610 is programmable and may be constructed in a manner similar to the multiplexers described above using transistors 612 and 614, each of which has its gate coupled to programmable elements 616 and 618, respectively.

The output of multiplexer 610 is coupled through an inverting buffer 620 to another multiplexer 624. Multiplexer 620 is also coupled at its other input to the output of a logic element 230 through an inverting buffer 626. The output of multiplexer 624 is coupled through an inverting buffer 628 to all of the horizontal conductors 210 through transistors 630–636, each of which has a programmable elements 640–646 coupled to its gate. In some embodiments, the output may only be coupled to a subset of horizontal conductors 210.

Row interconnect circuit 600 also has a pull-up transistor 650 that is coupled the output of multiplexer 610 to boost the signal from vertical conductor 210. It also includes a pull-down transistor coupled to the output of multiplexer 610. A NAND gate 660 and an OR gate 665 are coupled to the gate to turn pull-down transistor 655 on when neither programmable elements 616 and 618 are activated, or when the reset signal is activated.

Figure 7:
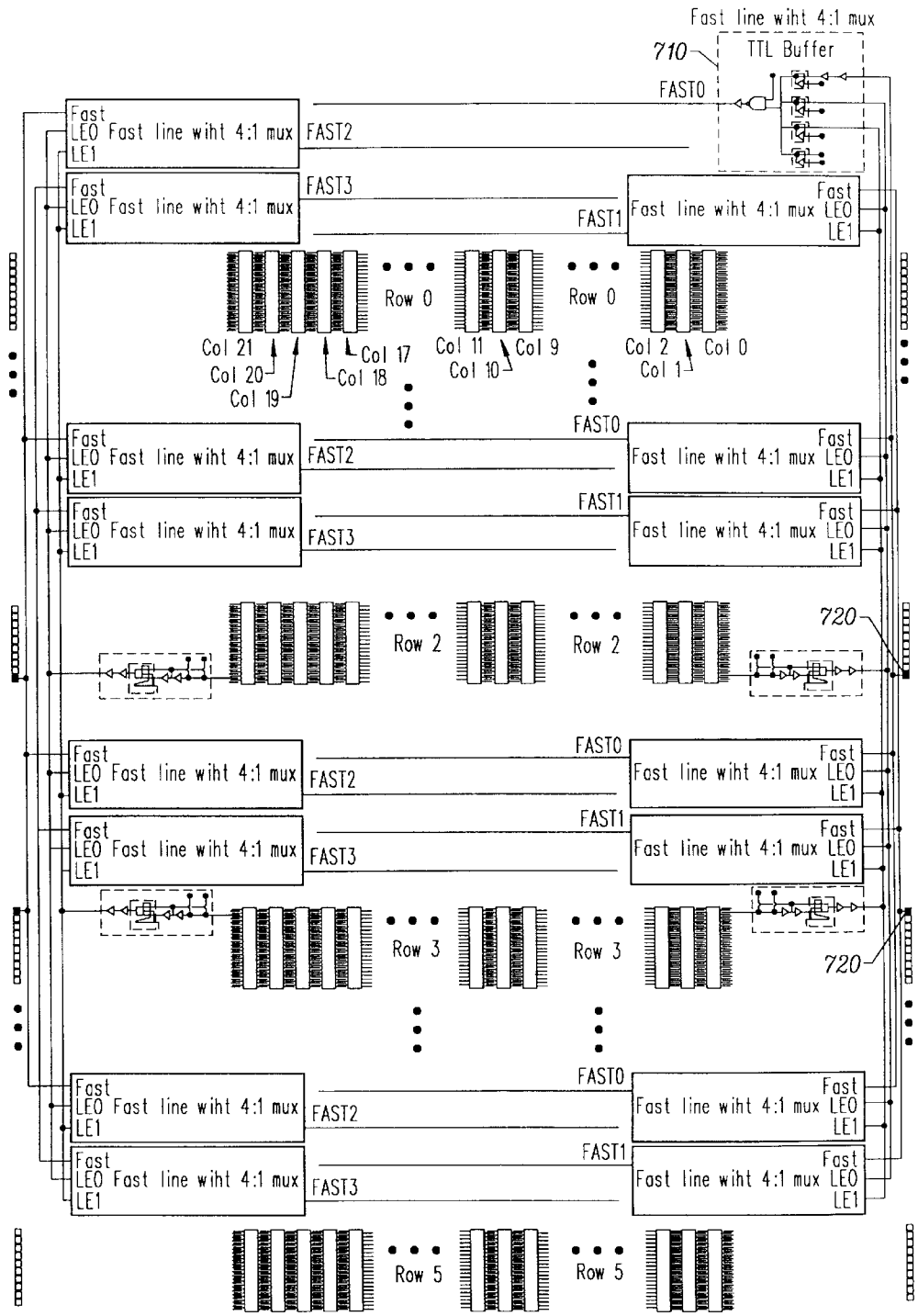
FIG. 7 is a block diagram of clock routing scheme that may be implemented in a programmable logic integrated circuit of the present invention.

FIG. 7 depicts a clocking scheme that may be implemented in programmable logic integrated circuit 121 of the present invention. A clock is typically used throughout the programmable logic integrated circuit 121 to allow synchronous operation. It is desirable in an integrated circuit to reduce the amount of clock skew. A large clock skew will degrade the overall system performance, since the device can only operate as fast as its slowest path.

In the specific embodiment, two clock skew components can be identified. Inter-row clock skew is the amount of skew between the horizontal rows, while inter-column clock skew is the amount of skew between the elements in a column for each row.

Referring to FIG. 7, a TTL buffer 710 is placed along each row of integrated circuit 121. Each TTL buffer 710 is coupled to a clock pin 720. A typical integrated circuit will have a plurality of clock pins 720. By this arrangement, each row has a similar clock skew. Thus, the clock skew is determined by the inter-column clock skew alone. of further advantage, since TTL buffer 710 is repeated for each row, the clock signal is driven to each row by the external driver, which is typically much larger than TTL buffer 710. Clock pins 720 are preferably centered along the left and right edges of integrated circuit 121 to further balance the clocking skews.

Figure 8:
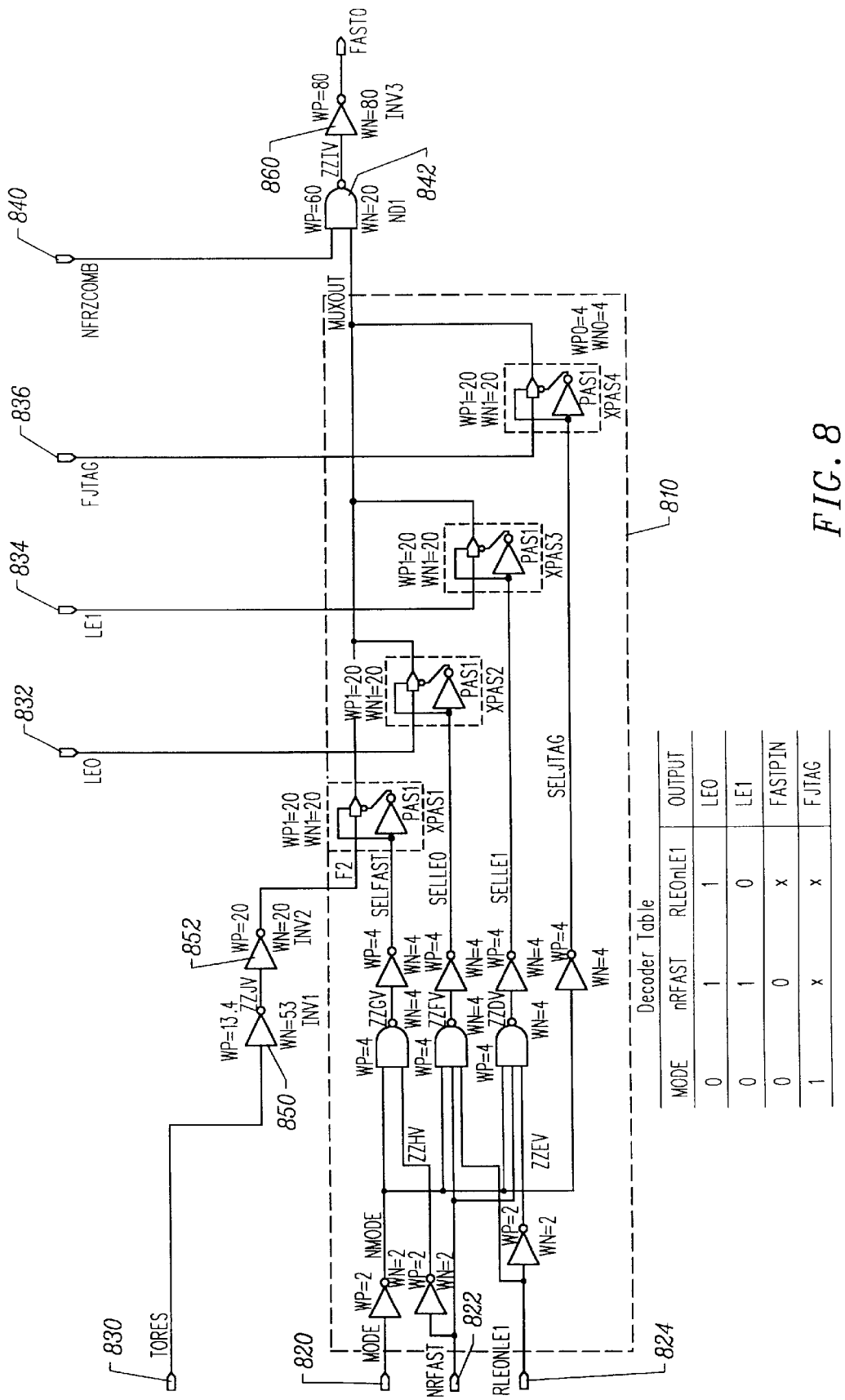
FIG. 8 is a logic diagram of a TTL buffer for the clock routing scheme of FIG. 7.

FIG. 8 shows a more detailed circuit diagram of TTL buffer 710. TTL buffer 710 includes a 4:1 multiplexer 810. Multiplexer 810 includes three control inputs (MODE 820, NRFAST 822, and RLEONE1 824.) Control inputs 820–824 determine which of the four input lines TTL buffer 710 will drive. In the specific embodiment, TTL buffer 710 is coupled to four different inputs through inputs 830, 832, 834, and 836. Clock input 830 is coupled to the clock pin. LE inputs 832 and 834 are coupled to fast outputs of logic element 230, and JTAG input 836 is coupled to a JTAG input. The decoder table in FIG. 8 shows how each line is selected by the values on control inputs 820–824. The inverse of a reset signal is provided on a reset input 840 which is coupled to a NAND gate 842. This drives the output to GROUND when the reset signal is activated.

Input 830 is coupled to the output through two inverting buffers 850 and 852. The output of multiplexer 810 is coupled to an output of TTL buffer 710 through a buffer 860 which drives the fast signal to the rows.

Figure 9:
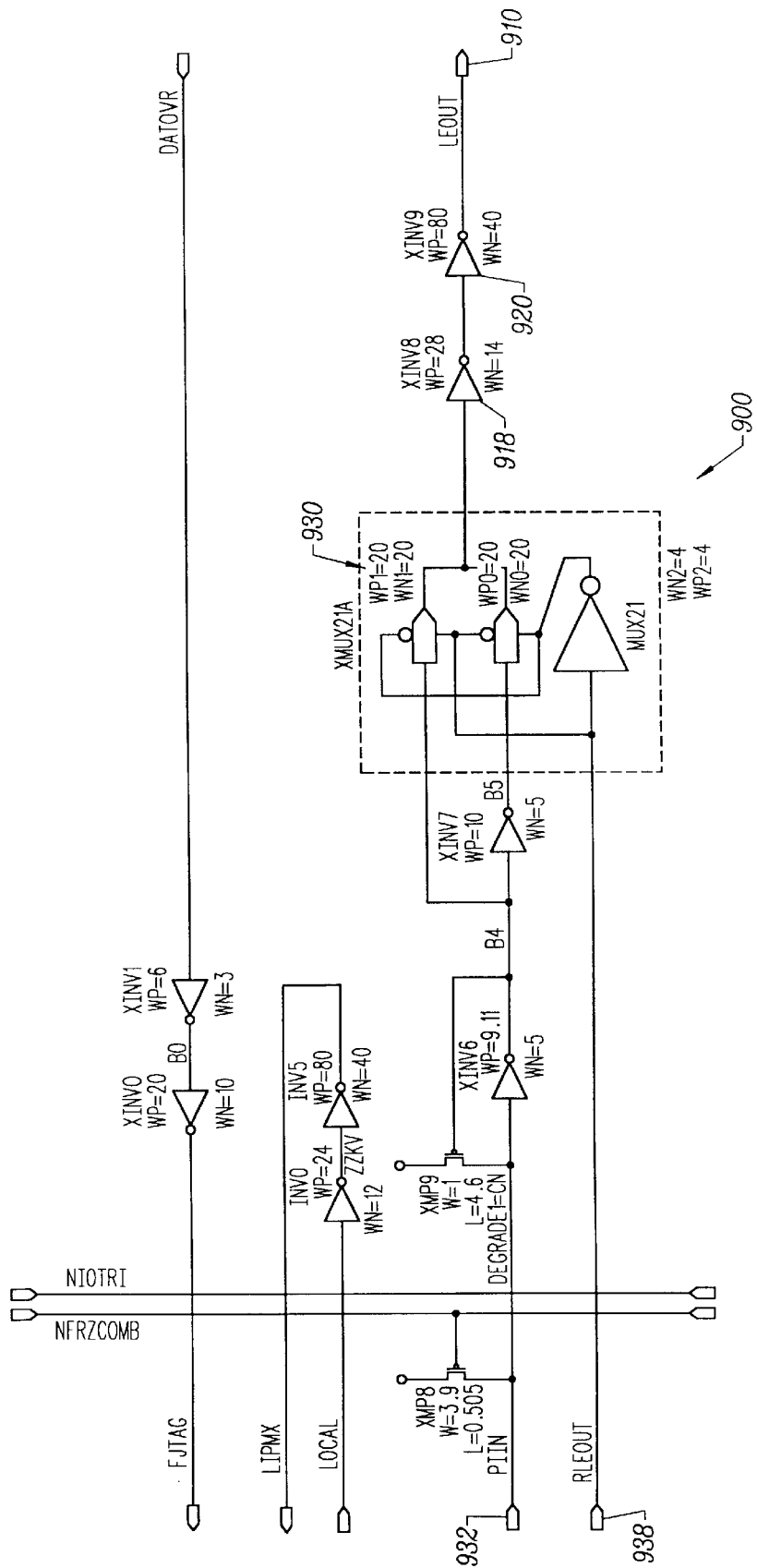
FIG. 9 is a logic element driver circuit for driving a fast output from a logic element.

The present invention also provides LE driver circuitry 900 to allow an asynchronous clock or other fast signal to be driven from logic elements 230. FIG. 9 shows a circuit diagram of LE driver circuitry 900 for driving the asynchronous clock from logic elements 230. An LE driver output 910 is coupled to either of LE inputs 832 or 834 of TTL buffer 710. Inverting buffers 918 and 920 are provided to boost the signal and drive LE driver output 910.

A programmable inversion circuit 930 is also provided to allow the user to selectively invert the asynchronous clock signal. When a signal on PIIN input 932 is asserted, the signal on an LE input 938 is inverted before being driven out on LE driver output 910. Otherwise, the signal is not inverted.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A programmable integrated circuit comprising:
   a plurality of rows of horizontal interconnect conductors;
   a plurality of columns of vertical interconnect conductors;
   a plurality of clock pins; and
   a first plurality of buffer circuits wherein each of the buffer circuits is coupled to a horizontal interconnect conductor in a unique one of the rows of horizontal interconnect conductors and to one of the clock pins, so that a horizontal interconnect conductor in each one of the rows is coupled to one of the buffer circuits,
   wherein each of the first plurality of buffer circuits comprises a multiplexer that is coupled to only one of the plurality of clock pins.

2. The programmable integrated circuit of claim 1 wherein each of the first plurality of buffer circuits comprises a multiplexer circuit that comprises:
   a first input coupled to receive a first signal from an output of a first logic element circuit, and
   a second input coupled to receive a second signal from an output of a second logic element circuit.

3. The programmable integrated circuit of claim 2 wherein the first input of each of the multiplexer circuits is coupled to first driver circuit that provides the first signal from the output of the first logic element circuit, and the second input of each of the multiplexer circuits is coupled to a second driver circuit that provides the second signal from the output of the second logic element circuit.

4. The programmable integrated circuit of claim 3 wherein the first driver circuit inverts the first signal in response to a third signal, and the second driver circuit inverts the second signal in response to a fourth signal.

5. The programmable integrated circuit of claim 2 wherein each of the multiplexer circuits further comprises a third input coupled to receive a clock signal from one of the clock pins.

6. The programmable integrated circuit of claim 5 wherein the third input of each of the multiplexer circuits is coupled to one of a second plurality of buffer circuits.

7. The programmable integrated circuit of claim 2 wherein each of the multiplexer circuits further comprises three control inputs.

8. The programmable integrated circuit of claim 1 wherein each of the buffer circuits comprises:
   a logic gate having a first input that receives a reset signal; and
   a multiplexer circuit coupled to a second input of the logic gate.

9. A method for providing clock signals to a programmable integrated circuit comprising a plurality of rows and columns of interconnect conductors, the method comprising:
   receiving the clock signals at a plurality of pins;
   buffering each of the clock signals received at the pins using buffer circuits to provide a plurality of buffered clock signals; and
   providing each one of the buffered clock signals to an interconnect conductor in a unique one of the rows of interconnect conductors without routing through a second one of the rows of interconnect conductors, wherein each of the buffer circuits comprises a multiplexer that is coupled to receive only one of the clock signals.

10. The method of claim 9 wherein each of the buffer circuits comprises multiplexer circuits; and wherein the method further comprises:
    selecting signals from logic element circuits using the multiplexer circuits.

11. The method of claim 10 further comprising:
    driving the signals from the logic element circuits into the multiplexer circuits using driver circuits.

12. The method of claim 9 wherein buffering each of the clock signals received at the pins using the buffer circuits to provide the buffered clock signals further comprises:
    selecting the clock signals using multiplexer circuits to provide the buffered clock signals.

13. The method of claim 12 wherein selecting the clock signals using the multiplexer circuits to provide the buffered clock signals further comprises:
    receiving a plurality of control signals at a plurality of multiplexer control inputs.

14. The method of claim 9 further comprising:
    resetting the buffered clock signals using reset signals coupled to the buffer circuits.

15. The method of claim 9 wherein each of the buffer circuits comprises a plurality of inverters coupled to receive one of the clock signals.

16. A programmable integrated circuit comprising:
    a plurality of rows of horizontal interconnect conductors;
    a plurality of columns of vertical interconnect conductors; and
    an interconnect circuit coupled between one of the rows and one of the columns that programmably couples a first vertical interconnect conductor in that column to any one of the horizontal interconnect conductors in that row, wherein the interconnect circuit selects a horizontal interconnect conductor from among the horizontal interconnect conductors in that row to be programmably coupled to the first vertical interconnect conductors in response to a control signal,
    wherein the interconnect circuit comprises a first multiplexer with a first input coupled to the first vertical interconnect conductor and a second input coupled to a second vertical interconnect conductor.

17. The programmable integrated circuit of claim 16 wherein the interconnect circuit further comprises a second multiplexer with a first input coupled to an output of the first multiplexer and a second input coupled to an output of a logic element.

18. The programmable integrated circuit of claim 16 wherein the interconnect circuit further comprises a first transistor coupled between an output of the first multiplexer and a first supply that boosts the signal at the output of the first multiplexer.

19. The programmble integrated circuit of claim 16 wherein the interconnect circuit further comprises a first transistor coupled between an output of the first multiplexer and a first supply that pulls down the signal at the output of the first multiplexer.

20. A programmble integrated circuit comprising:
    a plurality of rows of horizontal interconnect conductors;

a plurality of columns of vertical interconnect conductors; and an interconnect circuit coupled between one of the rows and one of the columns that selectively couples a first horizontal interconnect conductor in that row to any one of a plurality of vertical interconnect conductors in that column, wherein the interconnect circuit selects a vertical interconnect conductor from among the plurality of vertical interconnect conductors in that column to be programmably coupled to the first horizontal interconnect conductor in response to a control signal, wherein the interconnect circuit comprises a multiplexer circuit with a first input coupled to receive a first signal from the first horizontal interconnect conductor in the row and a second input coupled to receive a second signal from a logic element.

21. The programmable integrated circuit of claim 20 wherein the interconnect circuit comprises a first buffer circuit coupled to the first input of the multiplexer circuit and a second buffer circuit coupled to the second input of the multiplexer circuit.

22. A programmable integrated circuit comprising:

a plurality of rows of horizontal interconnect conductors;

a plurality of columns of vertical interconnect conductors; and an interconnect circuit coupled between one of the rows and one of the columns that selectively couples a first horizontal interconnect conductor in that row to any one of a plurality of vertical interconnect conductors in that column, wherein the interconnect circuit selects a vertical interconnect conductor from among the plurality of vertical interconnect conductors in that column to be programmably coupled to the first horizontal interconnect conductor in response to a control signal, wherein the interconnect circuit comprises a first transistor that boosts a first signal from the horizontal interconnect conductor in the row.

23. A programmable integrated circuit comprising:

a plurality of rows of horizontal interconnect conductors;

a plurality of columns of vertical interconnect conductors; and an interconnect circuit coupled between one of the rows and one of the columns that selectively couples a first horizontal interconnect conductor in that row to any one of a plurality of vertical interconnect conductors in that column, wherein the interconnect circuit selects a vertical interconnect conductor from among the plurality of vertical interconnect conductors in that column to be programmably coupled to the first horizontal interconnect conductor in response to a control signal, wherein the interconnect circuit further comprises a pass transistor coupled to the first horizontal interconnect conductor and having a control electrode coupled to a memory cell.

24. A programmable integrated circuit comprising:

a plurality of rows of horizontal interconnect conductors;

a plurality of columns of vertical interconnect conductors; and an interconnect circuit coupled between one of the rows and one of the columns that selectively couples a first horizontal interconnect conductor in that row to any one of a plurality of vertical interconnect conductors in that columns, wherein the interconnect circuit selects a vertical interconnect conductor from among the plurality of vertical interconnect conductors in that column to be programmably coupled to the first horizontal interconnect conductor in response to a control signal, wherein the interconnect circuit further comprises a plurality of pass transistors, each of the pass transistors being coupled to one of the plurality of vertical interconnect conductors in the column.

25. A method for programming an integrated circuit comprising rows of horizontal interconnect conductors and columns of vertical interconnect conductors, the method comprising:

selecting a first horizontal interconnect conductor from among the horizontal interconnect conductors in a first row in response to a first control signal by activating one of a plurality of transistors, each of the plurality of transistors being coupled to a first signal line and a unique one of the horizontal interconnection conductors in the first row;

coupling a vertical interconnect conductor in a first one of the columns to the first horizontal interconnect conductor in the first row through the first signal line using a multiplexer;

selecting a first vertical interconnect conductor from among the vertical interconnect conductors in a second column in response to a second control signal; and coupling a horizontal interconnect conductor in a second one of the rows to the first vertical interconnect conductor in the second column.

26. A method for programmable an integrated circuit comprising rows of horizontal interconnect conductors and columns of vertical interconnect conductors, the method comprising:

selecting a first horizontal interconnect conductor from among the horizontal interconnect conductors in a first row in response to a first control signal;

coupling a vertical interconnect conductor in a first one of the columns to the first horizontal interconnect conductor in the first row;

applying an output signal from a logic element to one of the horizontal interconnect conductors in the first row;

selecting a first vertical interconnect conductor from among the vertical interconnect conductors in a second column in response to a second control signal; and coupling a horizontal interconnect conductor in a second one of the rows to the first vertical interconnect conductor in the second column.

27. A method for programming an integrated circuit comprising rows of horizontal interconnect conductors and columns of vertical interconnect conductors, the method comprising:

selecting a first horizontal interconnect conductor from among the horizontal interconnect conductors in a first row in response to a first control signal;

coupling a vertical interconnect conductor in a first one of the columns to the first horizontal interconnect conductor in the first row;

selecting a first vertical interconnect conductor from among the vertical interconnect conductors in a second column in response to a second control signal;

coupling a horizontal interconnect conductor in a second one of the rows to the first vertical interconnect conductor in the second column; and applying an output signal from a logic element to one of the vertical interconnect conductors in the second column.

28. A programmable integrated circuit comprising:

a plurality of rows of horizontal interconnect conductors;

a plurality of columns of vertical interconnect conductors;

a plurality of clock pins; and a first plurality of buffer circuits, wherein each of the buffer circuits is coupled to a horizontal interconnect conductor in a unique one of the rows of horizontal interconnect conductors and to one of the clock pins, so that a horizontal interconnect conductor in each one of the rows is coupled to one of the buffer circuits, wherein each of the first plurality of buffer circuits comprises a multiplexer circuit that comprises a first input coupled to receive a first signal from an output of a first logic element circuit, and a second input coupled to receive a second signal from an output of a second logic element circuit.

29. The programmable integrated circuit of claim 28 wherein the first input of each of the multiplexer circuits is coupled to first driver circuit that provides the first signal from the output of the first logic element circuit, and the second input of each of the multiplexer circuits is coupled to a second driver circuit that provides the second signal from the output of the second logic element circuit.

30. The programmable integrated circuit of claim 29 wherein the first driver circuit inverts the first signal in response to a third signal, and the second driver circuit inverts the second signal in response to a fourth signal.

31. The programmable integrated circuit of claim 28 wherein each of the multiplexer circuits further comprises a third input coupled to receive a clock signal from one of the clock pins.

32. The programmable integrated circuit of claim 31 wherein the third input of each of the multiplexer circuits is coupled to one of a second plurality of buffer circuits.

33. The programmable integrated circuit of claim 28 wherein each of the multiplexer circuits further comprises three control inputs.

34. A programmable integrated circuit comprising:

a plurality of rows of horizontal interconnect conductors;

a plurality of columns of vertical interconnect conductors;

a plurality of clock pins; and a first plurality of buffer circuits, wherein each of the buffer circuits is coupled to a horizontal interconnect conductor in a unique one of the rows of horizontal interconnect conductors and to one of the clock pins, so that a horizontal interconnect conductor in each one of the rows is coupled to one of the buffer circuits, wherein each of the buffer circuits comprises a logic gate having a first input that receives a reset signal, and a multiplexer circuit coupled to a second input of the logic gate.

35. A method for providing clock signals to a programmable integrated circuit comprising a plurality of rows and columns of interconnect conductors, the method comprising:

receiving the clock signals at a plurality of pins;

buffering each of the clock signals received at the pins using buffer circuits to provide a plurality of buffered clock signals, wherein each of the buffer circuits comprises multiplexer circuits;

providing each one of the buffered clock signals to an interconnect conductor in a unique one of the rows of interconnect conductors without routing through a second one of the rows of interconnect conductors; and selecting signals from logic element circuits using the multiplexer circuits.

36. The method of claim 35 further comprising:

driving the signals from the logic element circuits into the multiplexer circuits using driver circuits.

37. A method for providing clock signals to a programmable integrated circuit comprising a plurality of rows and columns of interconnected conductors, the method comprising:

receiving the clock signals at a plurality of pins;

buffering each of the clock signals received at the pins using buffer circuits and selecting the clock signals using multiplexer circuits to provide the buffered clock signals; and providing each one of the buffered clock signals to an interconnect conductor in a unique one of the rows of interconnect conductors without routing through a second one of the rows of interconnect conductors.

38. The method of claim 37 wherein selecting the clock signals using the multiplexer circuits to provide the buffered clock signals further comprises:

receiving a plurality of control signals at a plurality of multiplexer control inputs.

39. A method for providing clock signals to a programmable integrated circuit comprising a plurality of rows and columns of interconnected conductors, the method comprising:

receiving the clock signals at a plurality of pins;

buffering each of the clock signals received at the pins using buffer circuits to provide a plurality of buffered clock signals;

providing each one of the buffered clock signals to an interconnect conductor in a unique one of the rows of interconnect conductors without routing through a second one of the rows on interconnect conductors; and resetting the buffered clock signals using reset signals coupled to the buffer circuits.

40. A method for providing clock signals to a programmable integrated circuit comprising a plurality of rows and columns of interconnect conductors, the method comprising:

receiving the clock signals at a plurality of pins;

buffering each of the clock signals received at the pins using buffer circuits to provide a plurality of buffered clock signals, wherein each of the buffer circuits comprise a plurality of inverters coupled to receive one of the clock signals; and providing each one of the buffered clock signals to an interconnect conductor in a unique one of the rows of interconnect conductors without routing through a second one of the rows of interconnect conductors.

* * * * *